United States Patent [19]

Calviello

[11] Patent Number: 4,665,413
[45] Date of Patent: May 12, 1987

[54] EDGE JUNCTION SCHOTTKY DIODE

[75] Inventor: Joseph A. Calviello, Kings Park, N.Y.

[73] Assignee: Eaton Corporation, Cleveland, Ohio

[21] Appl. No.: 874,803

[22] Filed: Jun. 13, 1986

Related U.S. Application Data

[63] Continuation of Ser. No. 683,687, Dec. 19, 1984, abandoned.

[51] Int. Cl.⁴ ............... H01L 29/48; H01L 27/12; H01L 29/06; H01L 29/80
[52] U.S. Cl. ................................ 357/15; 357/56; 357/4; 357/68; 357/14; 357/65
[58] Field of Search .............. 357/13, 14, 15, 56, 357/4, 23.7, 65, 68, 22

[56] References Cited

U.S. PATENT DOCUMENTS

| | | | |
|---|---|---|---|
| 3,878,553 | 4/1975 | Sirles et al. | 357/56 |
| 4,075,650 | 2/1978 | Calviello | 357/56 |
| 4,201,999 | 5/1980 | Howard et al. | 357/15 |
| 4,212,022 | 7/1980 | Beneking | 357/15 |
| 4,292,643 | 9/1981 | Kellner et al. | 357/15 |
| 4,315,275 | 2/1982 | Bert et al. | 357/14 |
| 4,466,008 | 8/1984 | Beneking | 357/15 |
| 4,549,194 | 10/1985 | Calviello | 357/70 |

Primary Examiner—J. Carroll
Assistant Examiner—R. P. Limanek
Attorney, Agent, or Firm—Andrus, Sceales, Starke & Sawall

[57] ABSTRACT

A schottky junction diode is provided by a substrate (32) having a mesa stacked thin horizontal semiconductor layer (34, 50) with an exposed edge (36) at a generally vertical side (38) of the mesa, and a schottky metal layer (40) having a generally vertical portion (42) over the semiconductor layer edge and forming a generally vertical schottky junction (44) having an area in $10^{-8}$ to $10^{-10}$ cm² range for operation at millimeter and submillimeter wave frequencies.

12 Claims, 27 Drawing Figures

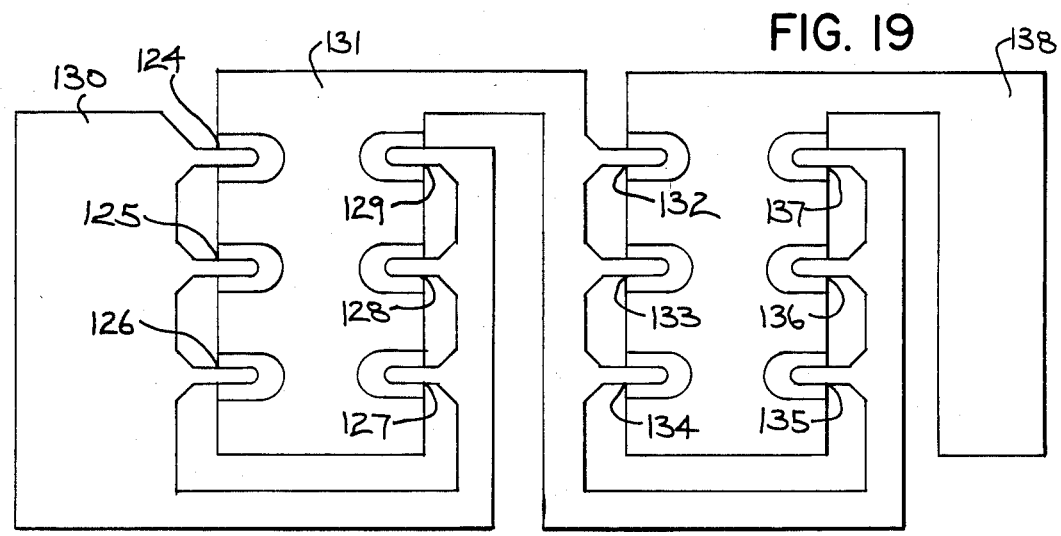
FIG. 19
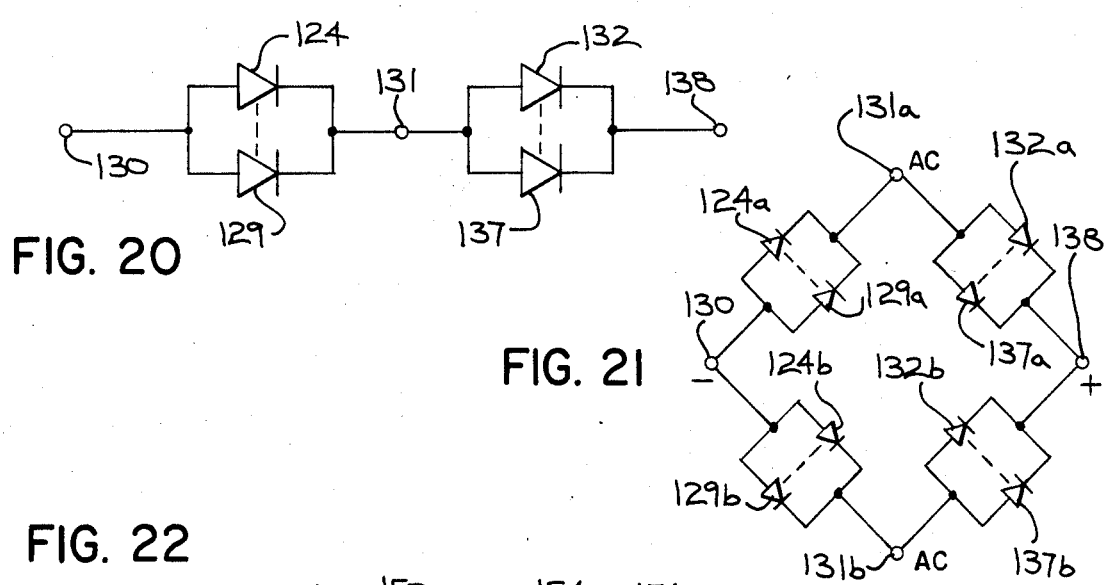
FIG. 20
FIG. 21
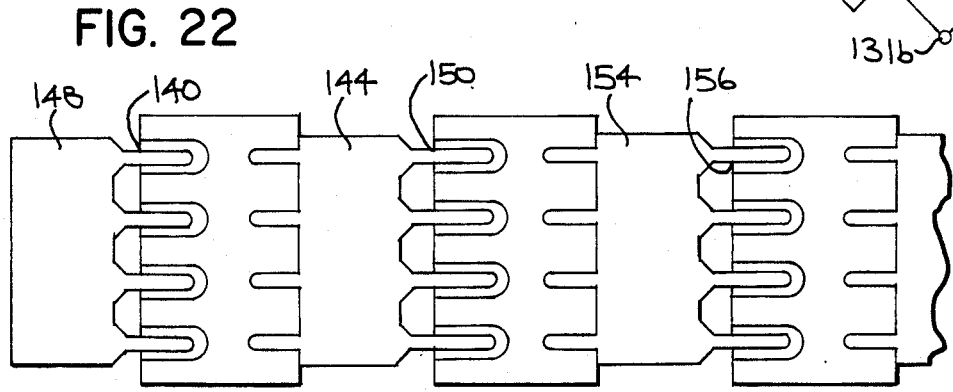
FIG. 22
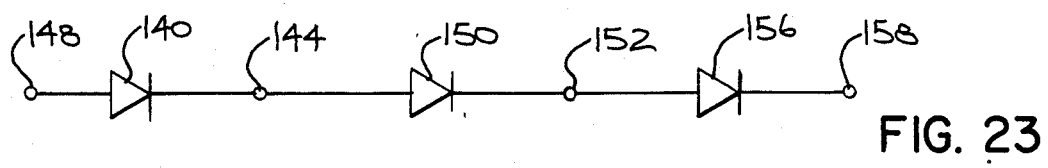
FIG. 23

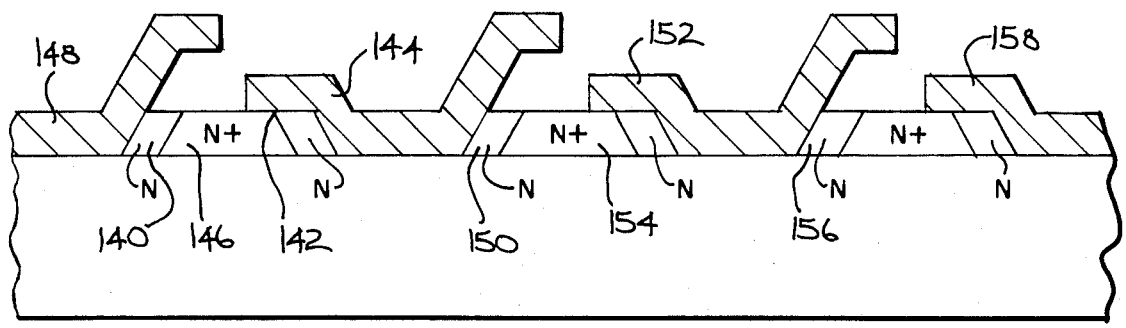
FIG. 24
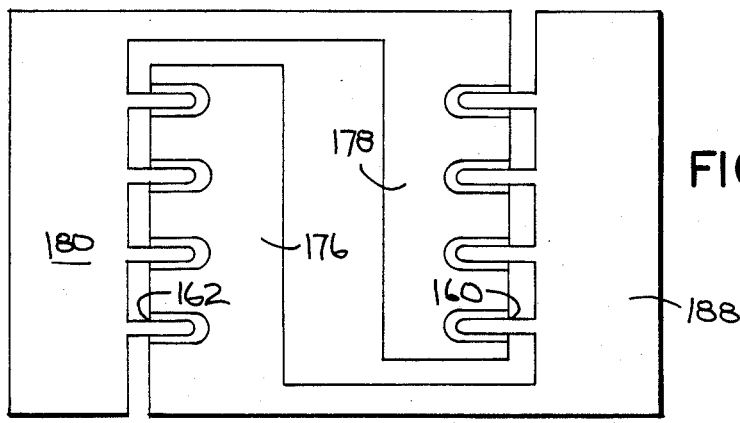
FIG. 25
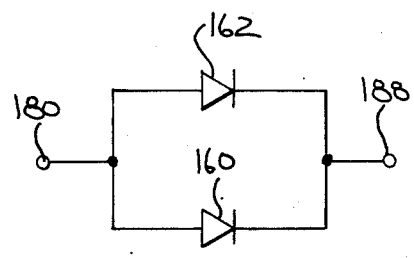
FIG. 26
FIG. 27
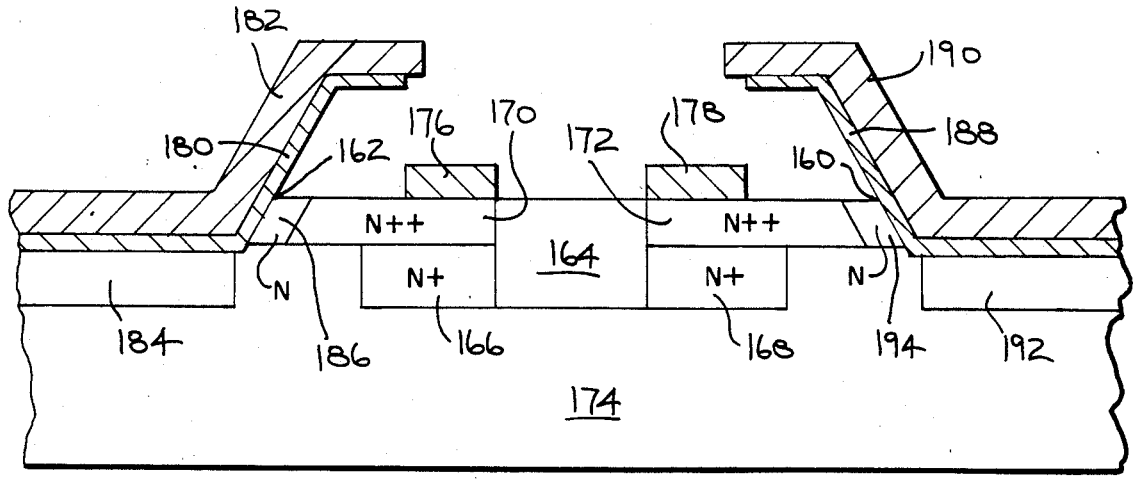

EDGE JUNCTION SCHOTTKY DIODE

This is a continuation of application Ser. No. 683,687, filed Dec. 19, 1984, now abandoned.

BACKGROUND

The invention relates to schottky junction diodes capable of operation at millimeter and submillimeter wave frequencies.

Characteristics useful for the development of a high quality diode intended for millimeter and submillimeter wave frequency operation include the ability to accurately predict skin effect contribution near the operating frequency from theoretical calculation based on device geometry, and the ability to verify these calculations by a low frequency measurement of the device.

Desirable device characteristics required for high performance mixers, detectors and imaging applications at the noted frequencies include an extremely low value of junction capacitance (near or below $10^{-16}$ farad) at zero volt bias, a junction area in the $10^{-8}$ to $10^{-10}$ cm$^2$ range, minimum variation in junction capacitance (ideally zero) as a function of bias potential, a low value of series resistance, a low value of parasitic capacitance (e.g. 1/10 of the capacitance), and near unity ideality factor.

The ideality factor is a measure of the perfection of the junction and is derived from the diode current equation $$I = I_s \left( \exp \frac{qV}{nKT} - 1 \right)$$

where
I is the diode current
$I_s$ is the saturation current
n is the ideality factor
q is electronic charge
V is voltage across anode to cathode
K is Boltzman's constant
T is absolute temperature
A perfect diode will have an ideality factor of unity.

In prior devices, such as planar point contact diodes and planar beam lead devices, the combination of all the above noted characteristics is not present in any one device. Furthermore, epitaxial N layers and N+ substrates are generally used universally as the basic substrate for such prior devices. The disadvantages of using this type of substrate include restricting fabrication to a single device, the necessity of measuring ohmic series resistance at or near the operating frequency which is a difficult and often impossible measurement at 100 gigahertz or higher frequency, poor reliability due to inherent premature breakdown, and poor collection of current resulting in high series resistance.

FIGS. 1-4 illustrate prior devices. FIGS. 1 and 2 show a typical circular schottky junction 2 on N layer 4 formed by etching a hole 6 in dielectric layer 8, such as SiO$_2$ or Si$_3$N$_4$ followed by evaporation of schottky metal and then etching of the excess metal to form the schottky metal contact 10. The lower portion of the device is an N+ substrate 12 to which ohmic contact 14 is made on the bottom surface. The smallest junction diameter possible with this type of fabrication is about 1 micron. Since the holes such as 6 in the dielectric layer 8 are chemically etched, the uniformity of junction diameter suffers as the dielectric thickness is increased. Current flow is from junction 2 through the entire device to ohmic contact 14. The skin effect loss is severe and occurs as the operating frequency is increased beyond the VHF range. The current is concentrated by the skin effect in a region near the surface, increasing the path length and decreasing the cross sectional area through which the current flows.

In FIGS. 3 and 4, a semi-insulating substrate 16 has N (approximately $10^{17}$ cm$^{-3}$) and N+ (near $1 \times 10^{18}$ cm$^{-3}$) layers 18 and 20 selectively formed therein, for example by ion implantation. Schottky metal 22 forms the schottky junction 24 on the upper planar surface, and the ohmic contact is provided at 26. The smallest contact area achieved is about $10^{-6}$ cm$^2$, and at best $10^{-7}$ cm$^2$. The structure is not adaptable to reduce the series resistance below 5 ohms for a junction capacitance of $10^{-14}$ farads. The parasitic shunt capacitance can be high, and approach $10^{-13}$ farad. This parasitic capacitance can be detrimental to the efficient operation of such device as a detector or mixer in the low millimeter (200 to 300 gigahertz) to submillimeter (above 300 gigahertz) range and near the optical region.

As seen in FIGS. 1-4, in prior devices the schottky contact 2 or 24 to the N layer is either made through etched holes in a dielectric layer or deposited directly on the surface of the N layer and its area defined by standard etching techniques. The junction area is limited to about $10^{-6}$ cm$^2$, and possibly approaching $10^{-7}$ cm$^2$, by the line width and resolution capability of available photolithographic processing techniques.

For millimeter and submillimeter wave frequency applications, the junction diameter should be in the micron and submicron range. To produce a small junction using planar technology, a very thin oxide layer (less than 1,000 angstroms) is necessary because the junction is defined photolithographically on the oxide layer. The oxide layer, generally used also as the passivating layer, is then etched through to the active layer to provide for the deposition of the schottky barrier metal layer which forms the junction. If this oxide layer was made thick, poor junction definition may result because the etching would not proceed uniformly through a thick oxide layer. In addition, it is not possible to completely remove all the oxide including the native oxides of the semiconductor layer by this technique, whereby there cannot be consistently achieved a junction ideality factor below about 1.1. Furthermore, using the above planar technology, the smallest junction area that can be achieved is in the $10^{-7}$ to $10^{-8}$ cm$^2$ range (junction diameter of 1 micron or greater). To achieve a junction area of about $10^{-10}$ cm$^2$ requires a junction diameter near 0.1 microns, which cannot be defined using existing techiques, including optical, X-ray or electron beam lithography.

SUMMARY

In the present invention, a well defined submicron schottky junction area in the range $10^{-8}$ to $10^{-10}$ cm$^2$ is provided despite the use of a thick protective passivating dielectric layer. This layer may be composed of silicon dioxide, or silicon dioxide plus a thin layer of silicon nitride, or a polycrystal gallium arsenide layer.

The extremely small junction area is formed at the edge of an epitaxially grown semiconductor layer which is sandwiched between a semi-insulating substrate and the top insulating layer. In this configuration, the junction area is the lateral horizontal width of the schottky contact times the generally vertical thickness of the semiconductor layer.

The parasitic shunt capacitance in the present invention is very low (less than or equal to $10^{-15}$ farads) in the noted configuration because the schottky metal contact outside the junction area lies fully on a semi-insulating gallium arsenide substrate. A very highly doped N++ ($5 \times 10^{18}$ to $5 \times 10^{19}$ cm$^{-3}$) layer is provided on the substrate, and an active N layer having the carrier concentration of about $10^{-17}$ cm$^{-3}$ and a thickness of about 0.05 to 0.1 micron is epitaxially grown on the N++ layer, reducing parasitic series resistance. In this thickness range, the active N layer is fully depleted at zero bias. Ohmic contact is formed on the highly doped N++ layer and within 1 micron of the schottky junction periphery. Cut-off frequencies near or above 20 terahertz ($20 \times 10^{12}$ hertz) are achievable, thus making it possible to fabricate detectors having excellent sensitivity when operating in the millimeter to submillimeter wavelength range.

The processing and method steps developed for the present invention enable fabrication of high performance and high reliability devices operating in the noted frequency range. The process used to fabricate the present devices is adaptable to micro-monolithic circuit integration where many devices, including active devices such as FETs, varactors and Gunn diodes, may be contained on the same substrate. Multiple device fabrication on a common substrate is possible because of the semi-insulating substrate which serves to electrically isolate the individual device and circuits. Varactors, for example, may be used to achieve tuning of a narrow band device response, and FETs used to integrate amplifiers for array and imaging applications.

The semi-insulating substrate confines the current flow to a path substantially directly between the schottky junction and the ohmic contact. This path is virtually identical for current flow at DC and at millimeter to submillimeter wave frequencies, making it possible to characterize the device at DC.

BRIEF DESCRIPTION OF THE DRAWINGS

Prior Art

Present Invention

Figure 1:
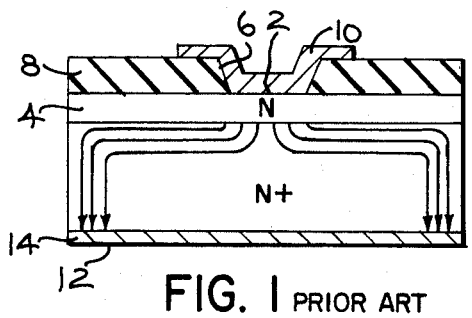
FIG. 1 is a schematic sectional side view of a known schottky junction diode of the planar point contact type.
Figure 3:
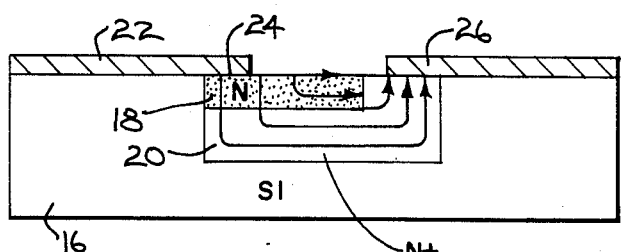
FIG. 3 is a schematic sectional side view of a known schottky junction diode of the planar beam lead type.
Figure 2:
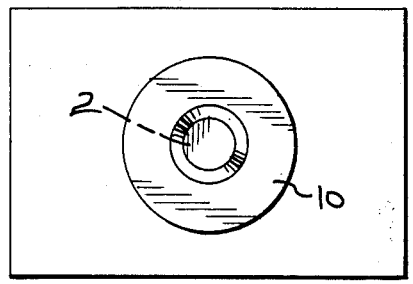
FIG. 2 is a top plan view of the device of FIG. 1.
Figure 4:
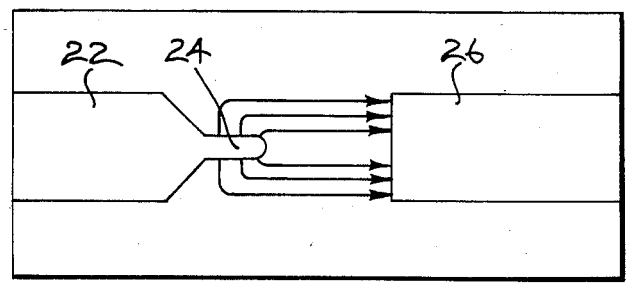
FIG. 4 is a top plan view of the device of FIG. 3.
Figure 5:
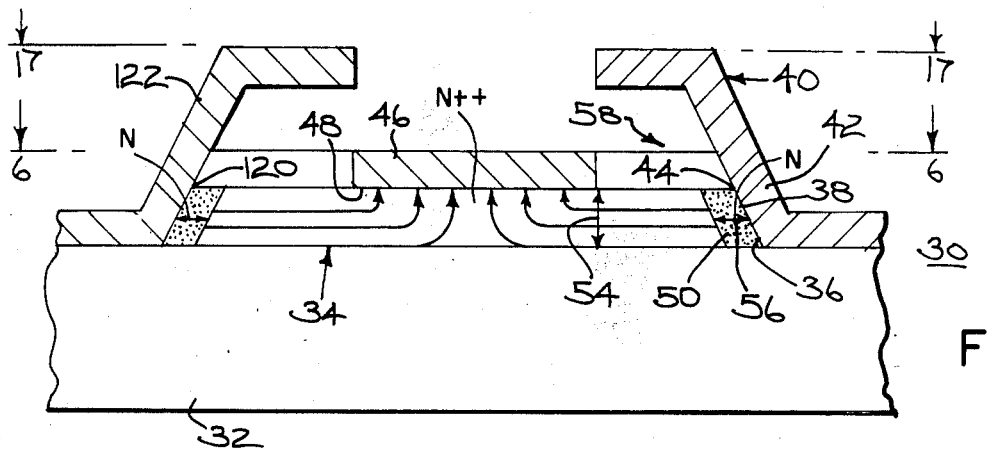

FIG. 5 is a schematic sectional side view of schottky junction diode structure constructed in accordance with the invention.

Figure 6:
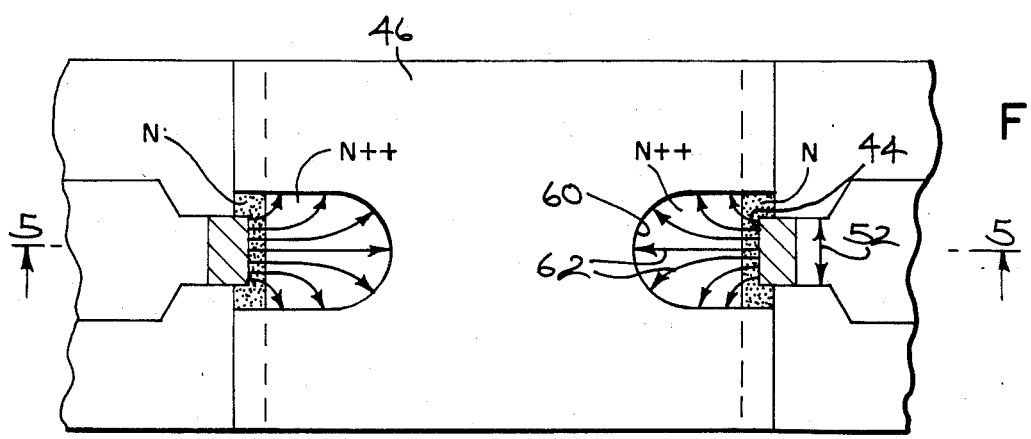
Figure 7:
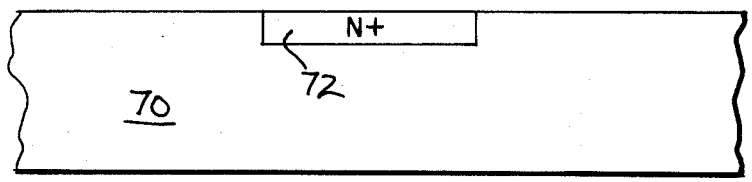
Figure 8:
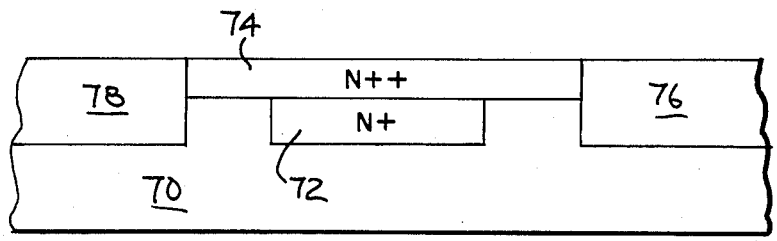

FIG. 6 is a view taken along line 6—6 of FIG. 5.

FIGS. 7–16 sequentially illustrate the processing steps for the structure of FIG. 5 in accordance with the invention.

Figure 17:
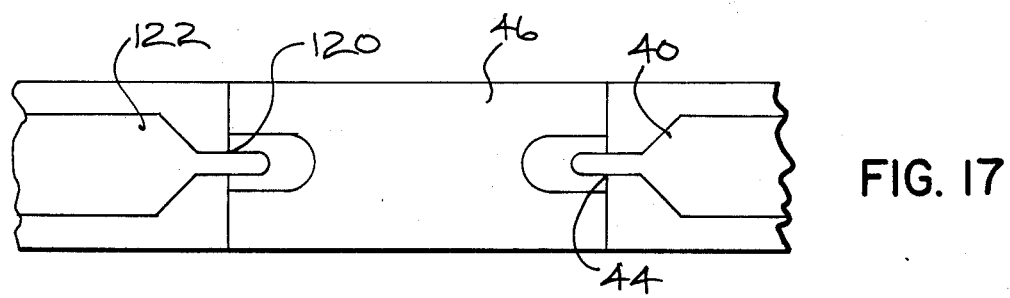

FIG. 17 is a top plan view taken along line 17—17 of FIG. 5.

Figure 18:
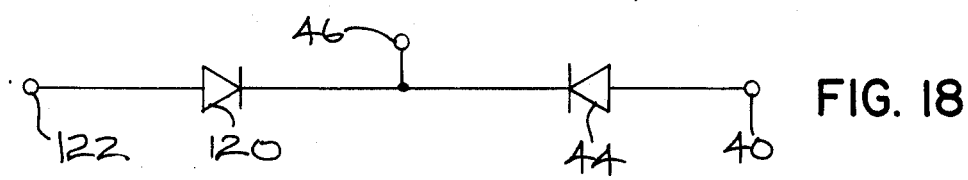

FIG. 18 shows the electric circuit equivalent of FIG. 17.

FIG. 19 is a view like FIG. 17 but showing an alternate embodiment.

FIG. 20 shows the electric circuit equivalent of FIG. 19.

FIG. 21 shows an electric circuit implementation of the structure of FIGS. 19 and 20.

FIG. 22 is a view like FIG. 17 but showing another alternate embodiment.

FIG. 23 is the electric circuit equivalent of the structure of FIG. 22.

FIG. 24 is a schematic sectional side view of the structure of FIG. 22.

FIG. 25 is a view like FIG. 17 but showing another alternate embodiment.

FIG. 26 shows the electric circuit equivalent of the structure of FIG. 25.

FIG. 27 is a schematic cross section of the structure of FIG. 25.

DETAILED DESCRIPTION

FIG. 5 shows a schottky junction diode 30 in accordance with the invention. The diode is formed on a substrate 32 of electrically insulating material, such as dielectric material, or semiconductor material doped to a semi-insulating condition. Insulator substrate 32 has a mesa stacked thin horizontal semiconductor layer 34 with an exposed edge 36 at a generally vertical side 38 of the mesa, such as along the 111 plane. A schottky metal layer 40 has a generally vertical portion 42 over semiconductor layer edge 36 and forming a generally vertical schottky junction 44. A second metal layer 46 provides an ohmic contact on the upper planar horizontal surface 48 of semiconductor layer 34 and provides the cathode current collector for the diode from the anode current emitter 40.

Semiconductor layer 34 preferably includes a layer 50 of different carrier concentration formed at the exposed edge. Second layer 50 extends generally vertically along the mesa side and has a vertical length substantially equal to the vertical thickness of layer 34. The lateral horizontal width of schottky metal layer portion 42 along the side of the mesa is shown at dimension 52, FIG. 6. The vertical length of semiconductor layer 50 is shown at dimension 54, FIG. 5. The schottky junction 44 is defined by the lateral horizontal width 52 and the vertical length 54, and has an area in the range $10^{-8}$ to $10^{-10}$ cm$^2$. Dimension 54 is about 0.1 micron or less. The horizontal width of layer 50 is shown at dimension 56 and is about 0.1 micron. In one device, dimension 54 was about 500 angstroms and dimension 52 was about 5,000 angstroms, resulting in a junction area of about $2.5 \times 10^{-10}$ cm$^2$.

The upper surface 48 of layer 34 also includes an insulator layer at 58 such as SiO$_2$, Si$_3$N$_4$, or polycrystal gallium arsenide, to be described. Layers 34 and 50 are supported on substrate 32 and sandwiched between substrate 32 and an insulator layer at 58.

Ohmic contact metal layer 46, FIG. 5, has a top plan view horizontal surface configuration with a concave cutout inner perimeter 60 spaced from schottky junction 44 such that current flows horizontally in a fan shape, as shown at arrows 62, from vertical schottky junction 44 to perimeter 60. Perimeter 60 is spaced from schottky junction 44 by a variable radius for example 1-3 microns.

Referring to the processing in FIGS. 7–14, an insulator substrate 70, such as gallium arsenide, is masked and an N+ layer 72 deposited therein and annealed. Other methods of epitaxial growth can also be used, such as vapor phase epitaxy and molecular beam epitaxy. The purpose of N+ layer 72 is to reduce parasitic series resistance.

A highly doped N++ layer 74 (greater than or equal to about $10^{19}$ cm$^{-3}$) is epitaxially grown by molecular beam epitaxy over the entire surface. This is followed by a proton bombardment to convert selected areas 76 and 78 back to semi-insulating material. Rather than the molecular beam epitaxy over the entire surface and the proton bombardment, a selective implantation can instead be used to deposit N++ layer 74 if a carrier concentration of about $2 \times 10^{18}$ cm$^{-3}$ is acceptable.

Figure 9:
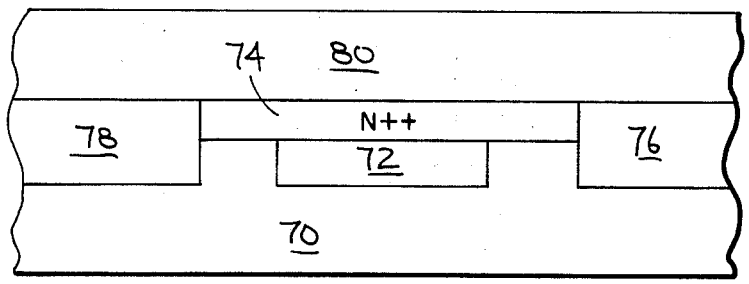
Figure 10:
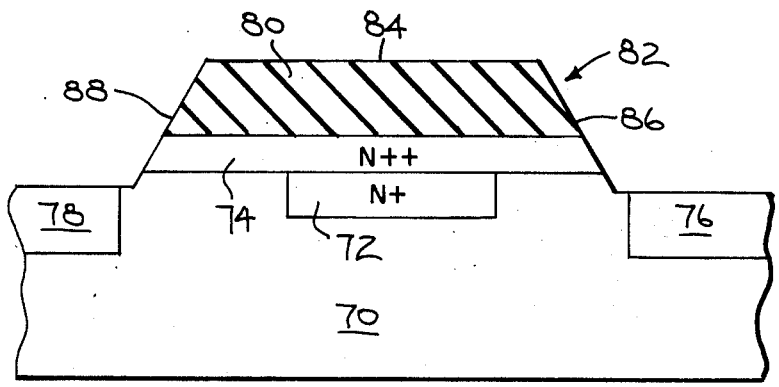

A thick insulator layer 80, FIG. 9, (1,000 to 6,000 angstroms), such as polycrystal gallium arsenide, silicon dioxide, or silicon nitride and silicon dioxide, is deposited over the entire surface by sputtering or evaporation. A dry plasma etch is then used to define a mesa 82, FIG. 10, having a top 84 and generally vertical sides 86 and 88, for example lying in the 111 plane. If SiO$_2$, or SiO$_2$ and Si$_3$N$_4$, is used as insulator layer 80, a layer of photoresist is first applied and processed to define the desired shape of the surface to be etched. The wafer is then placed in an RF sputtering system. Using carbon tetrafluoride, (CF$_4$), a gas pressure of about 100 to 300 microns and a poyer level of about 30 to 70 watts, the insulator layer 80 is etched. If a gallium arsenide polycrystal film is instead used for layer 80, a gas composed of a mixture of CCl$_2$F$_2$ and H$_e$ in the ratio of 1:1 can be used to etch layer 80 using the same RF sputtering system and similar etching parameters. The height of the etched mesa is controlled so that generally vertically edges 86 and 88 expose the full thickness of N+ layer 74, FIG. 10.

Following a thorough cleaning of the surface, the wafer is placed in a molecular beam epitaxy or a vapor phase system. Using molecular beam epitaxy, an active N layer is deposited over the complete surface. In this step, epi-growth of single crystal N epilayer positions 90 and 91 will selectively occur only at the exposed edges 73 and 75 of N++ single crystal layer 74. Over the remaining surface, which includes the proton bombarded areas 76 and 78 and insulator layer 80 along the sides 86 and 88 and top 84 of the mesa, the deposited N epilayer will be polycrystal, i.e., semi-insulating. This polycrystal semi-insulating remaining portion of the epilayer is shown at 92.

Figure 11:
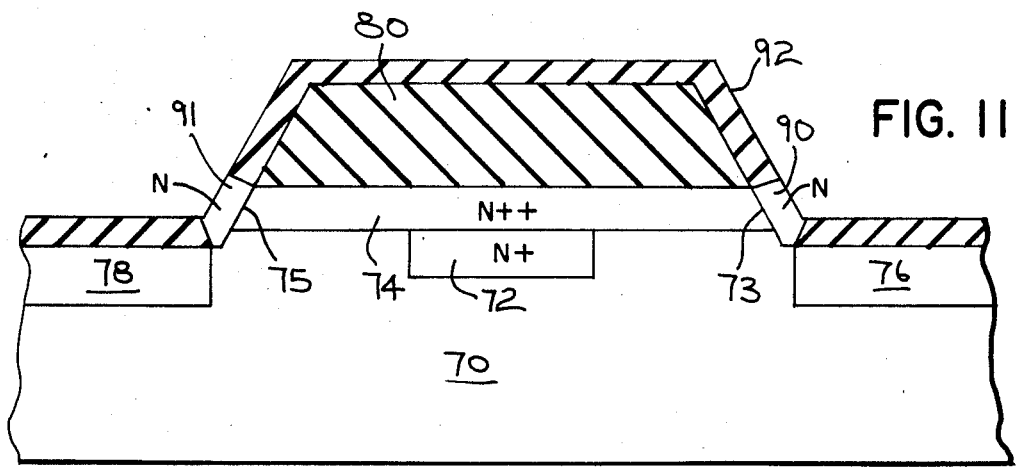

If molecular beam epitaxy was used in conjunction with the steps shown in FIG. 11, deposition of schottky metal 94 is then performed in situ. By using molecular beam epitaxy in FIG. 11, it is possible to grow the desired epitaxial layer, and without exposing this layer to ambient, the schottky metal may be deposited immediately and in the same system or growth chamber. This method of performing growth and evaporation without exposure to ambient is an in situ process. By this technique, it is possible to achieve a near unity ideality factor since the metal-semiconductor interface is free from oxides and/or impurities.

Figure 12:
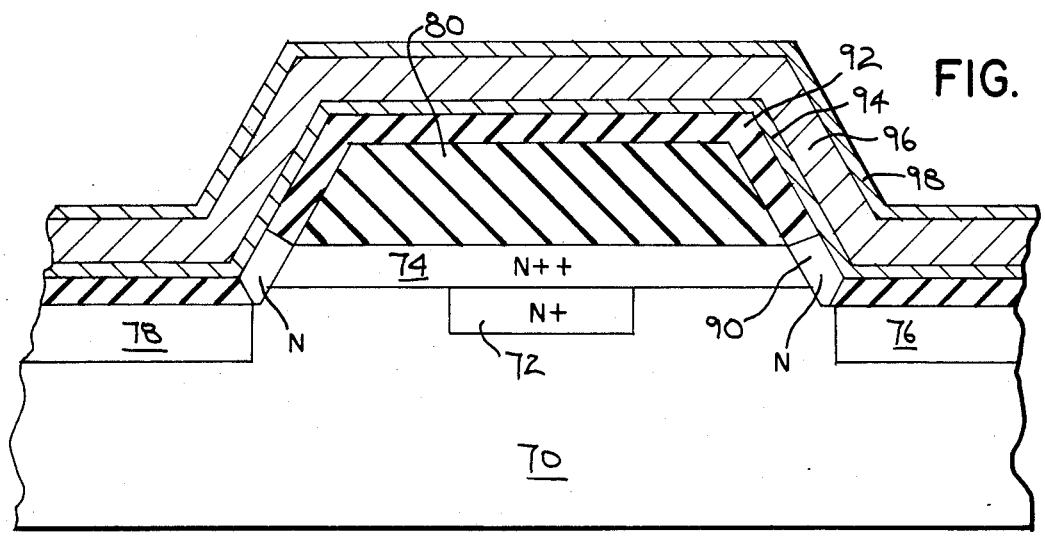
Figure 13:
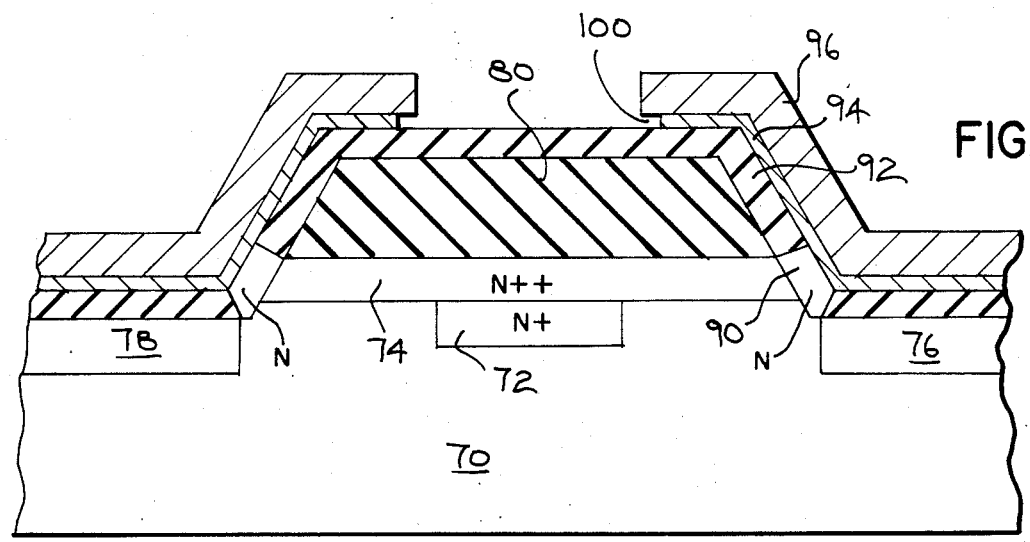

Schottky metal 94, FIG. 12, such as tantalum, molybdenum or tungsten is deposited to a thickness of about 500 to 2,000 angstroms. A thick gold layer 96 (2,000 to 10,000 angstroms) is then deposited, followed by deposition of a tantalum layer 98 (1,000 to 3,000 angstroms).

Photoresist is then applied to etch the surface in a desired shape, including the top of the mesa. The wafer is placed in an RF sputtering system, and using carbon tetrafluoride, CF$_4$, 100 to 400 micron pressure, and 50 to 100 watts of RF power, the top tantalum layer 98 is etched. During this etching step, the photoresist acts as a mask. Next, the photoresist is removed and the wafer is placed back in the sputtering system. Using 90 percent argon and 10 percent oxygen, a pressure to 10 to 30 microns and 50 to 100 watts of RF power, gold layer 96 is etched. In this etching step, the oxygen oxidizes remaining top tantalum layer 98 while argon etches gold layer 96. During this etching, the top tantalum or other refractory metal layer 98 acts as a mask for the gold. After the gold is etched, the gas is changed back to CF$_4$/O$_2$ in the ratio of 98%/2%. In this step, the top tantalum layer 98 and the bottom schottky metal layer 94 are simultaneously etched. Increasing the pressure to 300 to 800 microns, additional etch of bottom refractory metal layer 94 will occur, creating an undercut 100, FIG. 13, below gold layer 96, which further reduces the lateral horizontal width 52, FIG. 5, of the schottky junction to provide a smaller area.

Figure 14:
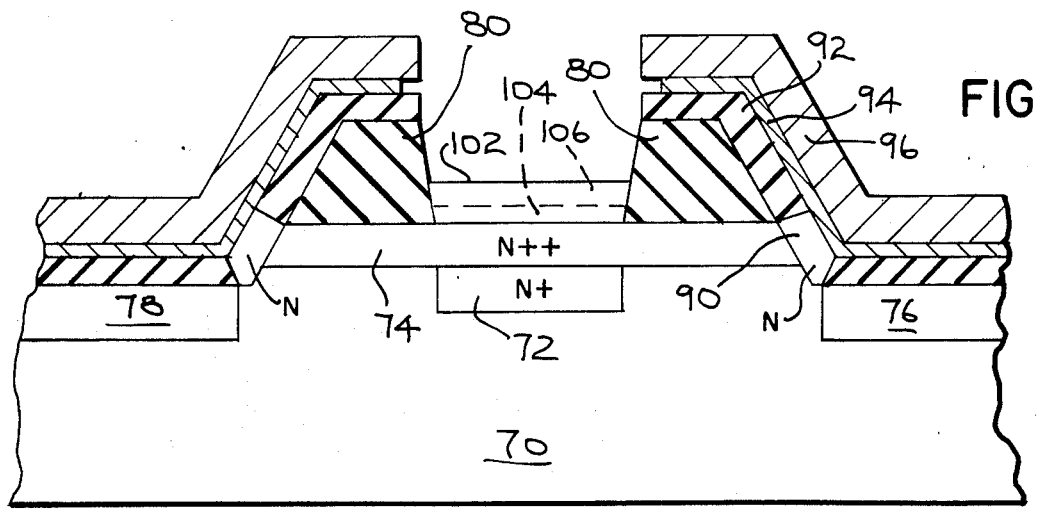

Using the dry etch technique noted above in conjunction with FIG. 10, and photoresist as the mask media, layer 80 is then etched down through the top of the mesa to expose the upper surface of N++ layer 74, FIG. 14. Germanium gold (1,000 Å) is then deposited by evaporation onto N++ layer 74 to provide ohmic contact 102. If the carrier concentration of N++ layer 74 is in the 1 to $5 \times 10^{19}$ cm$^{-3}$ range, an ohmic contact can be achieved by depositing a layer of refractory metal as shown at dashed line 104 and a thick gold overlayer 106, instead of the germanium gold. Using this latter type of contact, the refractory metal 104 acts as a diffusion barrier for the gold 106, and thus enables fabrication of a very highly reliable device capable of operating temperatures approaching 300° C. In addition, using the latter contact technique reduces the number of processing steps by defining the junction and ohmic contact simultaneously.

Figure 15:
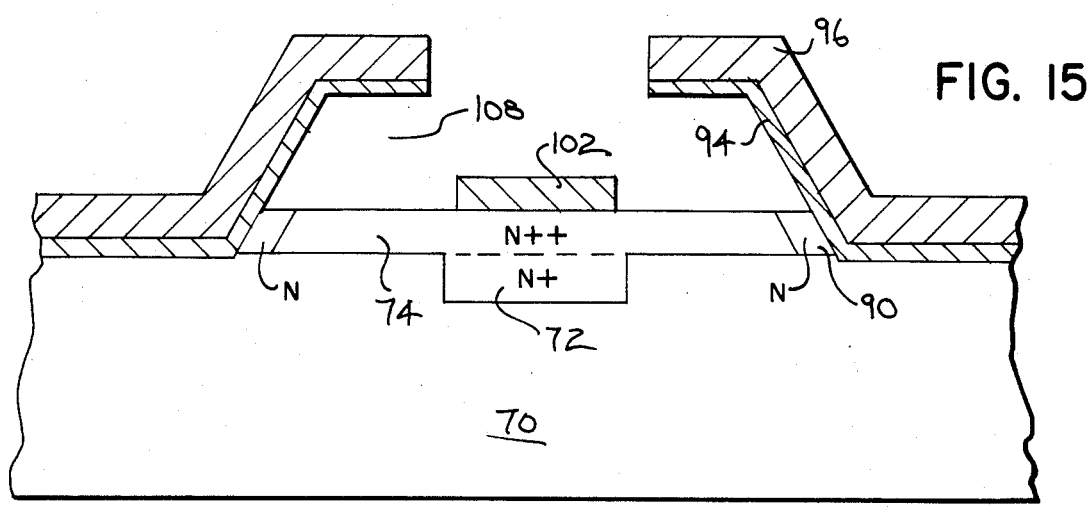
Figure 16:
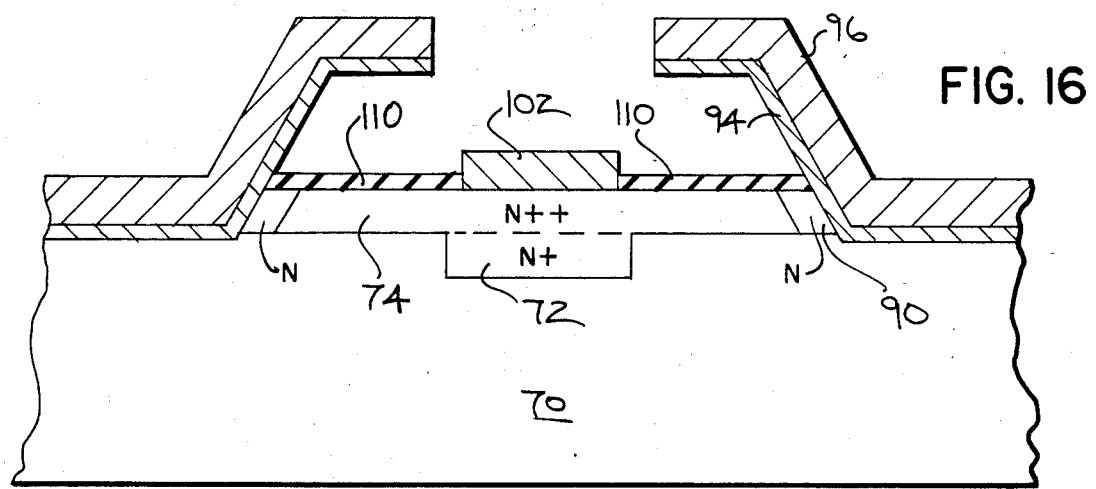

The parasitic shunt capacitance contribution of the overhanging semi-arch lead, provided by the upper portion of gold layer lead 96, can be reduced by fully etching away layer 80 to provide an air gap 108, FIG. 15. For example, if SiO$_2$ is used for insulator layer 80, a standard buffered oxide etch may be used to completely etch the SiO$_2$ away without affecting the rest of the structure. However, to provide surface passivation, SiO$_2$ and Si$_3$N$_4$ may be used for insulator layer 80, and the SiO$_2$ etched away, leaving the Si$_3$N$_4$ layer 110, FIG. 16, for passivation. In another alternative, gallium arsenide polycrystal may be used for insulator layer 80, and partially etched away to leave a layer for passivation, shown at dashed line 112 in FIG. 16.

FIG. 17 shows a top plan view taken along line 17—17 of FIG. 5, and FIG. 18 shows the electric circuit equivalent. Schottky junctions 44 and 120 are represented at diodes 44 and 120 having emitters 40 and 122 and a common cathode at 46. This arrangement provides a pair of diodes in antiseries relation.

FIG. 19 is a view like FIG. 17 but showing a two dimensional array of junctions, and FIG. 20 shows the equivalent circuit therefor. A plurality of diodes 124–129 are connected in parallel between anode 130 and cathode 131. Another set of parallel diodes 132–137 is connected in series with first set 124–129 between electrode 131 as anode and a cathode 138. This configuration may be used to provide full wave rectification by providing two such structures in parallel, as shown in FIG. 21 with the first structure of FIG. 20 having an AC input at terminal 131a and its DC outputs at 138 and 130, and with the second-identical structure from FIG.

20 having its AC input at 131b and its positive DC output at 138 and its negative DC output at 130.

FIG. 22 is a view like FIG. 17, and FIG. 23 shows the equivalent circuit useful for half wave rectification. FIG. 24 shows a sectional side view for the structure of FIG. 22 wherein only one side of the mesa has a schottky junction, as at 140, and the other side of the mesa has an ohmic contact at 142 with metallization 144 extending only partially upwardly and then along the top of and ohmically contacting N+ layer 146. In this configuration, current flows from schottky metal anode contact 148 across diode junction 140 and through layer 146 to cathode contact 144 which is the anode for the next schottky junction diode 150 across which current flows to cathode contact 152 ohmically contacting the upper surface of N+ layer 154, which electrode 152 provides the anode for schottky junction diode 156 having a cathode 158, and so on.

FIG. 25 is a view like FIG. 17 and FIG. 26 is the circuit equivalent showing a pair of diodes connected in antiparallel relation, for subharmonic applications. FIG. 27 shows a schematic cross section of the device of FIG. 25, illustrating isolated schottky junctions 160 and 162. The N+ layer 72 and N++ layer 74 of FIG. 15 are separated and isolated by proton bombarded semi-insulating central region 164, FIG. 27, providing left and right respective N+ and N++ layers 166, 168, 170 and 172 on insulator substrate 174. Separate ohmic contacts 176 and 178 are provided. Semi-arch left schottky metal layer 180 and gold overlayer 182 extend along the substrate over proton bombarded insulating region 184 then over N region 186 to form schottky junction 162 and then upwardly over and spaced above N++ layer 170. Right schottky metal layer 188 and gold overlayer 190 likewise extend along proton bombarded semi-insulating region 192 in the substrate then over N layer 194 to form schottky junction 160 and then upwardly over and spaced above N++ layer 172, as in FIGS. 5 and 15.

To achieve low ohmic losses, it is essential to minimize skin effect losses, reduce interelectrode spacing and collect as much current as possible emminating from the schottky junction. These goals are achieved with the present invention. In one embodiment, the separation between schottky junctions 44 and 120, FIG. 5, is about 4 microns. By using molecular beam epitaxy, the N++ layer can be very highly doped (1 to $5 \times 10^{19}$ cm$^{-3}$). These features help minimize losses down to a level making it possible to achieve zero volt bias cutoff frequency in excess of $10 \times 10^{12}$ hertz and approaching 20 to 30 $\times 10^{12}$ hertz. The structural geometry in accordance with the invention enables the integration of an array of closely spaced junctions, for example as close as 2 microns in FIG. 19, thus enabling the fabrication of very sensitive detectors and high efficiency mixers. The overhanging metal contact, such as the upwardly extending gold overlayer 40 in FIG. 5 spaced above layer 34 may be used to integrate antennas that are very close to the junctions and thus improve coupling to incoming radiation.

In accordance with the processing technology and the structural geometry disclosed, it is possible to define extremely small junction areas with a high degree of resolution, uniformity, repeatability and reliability. Devices fabricated in accordance with the invention exhibit a near unity ideality factor and an RC product near or below $10^{-15}$ seconds.

The invention provides a gallium arsenide schottky barrier diode having a junction area in the $10^{-8}$ to $10^{-10}$ cm$^2$ range in a quasi planar structure, formed at the edge of an epitaxially grown N/N++ layer. The structure enables the device to be formed on a semi-insulating substrate to provide for isolation from adjacent devices on the same substrate. This makes it possible to integrate numerous junctions to fabricate devices for fundamental and balanced mixers, subharmonic mixers, detector arrays, and to reduce the parasitic shunt capacitance near or below $10^{-15}$ farads. In addition, the structure lends itself to the fabrication of efficient detectors with integrated monopoles or full wave dipole antennas. The extremely small junction area necessary for efficient operation at submillimeter wave frequencies is enabled by the structural geometry and configuration and the disclosed processing.

It is recognized that various alternatives and modifications are possible within the scope of the appended claims. Specific parameters and data have been disclosed for particular structures and technologies and are believed accurate, however the invention is not limited thereby.

I claim:

1. A schottky junction diode comprising:
    a substrate having a mesa stacked horizontal uniplanar semiconductor N++ layer with an exposed edge at a generally vertical side of the mesa;
    a second semiconductor N layer formed at said exposed edge without overlap on the upper planar horizontal surface of said first mentioned semiconductor layer;
    a schottky metal layer having a generally vertical portion over said second semiconductor layer and forming a generally vertical schottky junction therewith with overlap and without contact on said upper planar horizontal surface of said first semiconductor layer, said schottky metal layer providing an anode current emitter for the diode; and
    a second metal layer on said upper planar horizontal surface of said first semiconductor layer without overlap on the vertical side edge of the mesa and horizontally spaced from said schottky junction and providing an ohmic contact to said first mentioned semiconductor layer and a cathode current collector for the diode.

2. The invention according to claim 1 wherein said second semiconductor layer extends generally vertically along said mesa side over said exposed edge of said first semiconductor layer, and wherein said second semiconductor layer has a vertical length substantially equal to the vertical thickness of said first semiconductor layer.

3. The invention according to claim 2 wherein said schottky junction is defined by the lateral horizontal width of said schottky metal layer along said mesa side and by the vertical length of said second semiconductor layer and has an area in the range $10^{-8}$ to $10^{-10}$ cm$^2$.

4. The invention according to claim 2 wherein said second metal layer is on an upper planar horizontal surface of said first semiconductor layer and has a top plan view horizontal surface configuration with a concave cutout inner perimeter spaced from said schottky junction such that current flows horizontally in a fan shape from said vertical schottky junction to said concave cutout inner perimeter of said second metal layer.

5. The invention according to claim 4 comprising a third metal layer on said schottky metal layer having a generally vertical section along the mesa side and extending upwardly beyond said first and second semiconductor layers and over and spaced thereabove in a semiarch configuration.

6. The invention according to claim 1 wherein:
said mesa initially includes an insulator layer over said first semiconductor layer, and said second semiconductor layer is provided by growth of an epilayer over the top and sides of said mesa and over said substrate, single crystal semiconductor epimaterial selectively growing only at said edge of said first semiconductor layer while polycrystal insulating epimaterial grows on the remainder of the mesa side and top and on said substrate;
said schottky metal layer is on said epilayer and contacts said second semiconductor layer along a generally vertical plane along the mesa side and forms said schottky junction therealong;
said second semiconductor layer extends generally vertically along the mesa side over said exposed edge of said first semiconductor layer, said second semiconductor layer has a vertical length substantially equal to the vertical thickness of said first semiconductor layer, said second semiconductor layer being horizontally between said first semiconductor layer and said schottky metal layer; and
comprising a third metal layer on said schottky metal layer over said epilayer, the mesa top being etched through to expose said first semiconductor layer for deposition of said second metal layer.

7. The invention according to claim 6 wherein said second metal layer providing ohmic contact to said first semiconductor layer comprises a layer of refractory metal and an overlayer of gold, said last mentioned layer of refractory metal acting as a diffusion barrier for said overlayer of gold.

8. The invention according to claim 6 wherein said second metal layer providing ohmic contact to said first semiconductor layer is germanium gold.

9. The invention according to claim 6 wherein said third metal layer comprises a gold layer covering the substrate and the top and sides of the mesa, and a refractory metal layer on said gold layer, said refractory metal layer being etched on the top of the mesa, whereafter said gold layer is etched on the top of the mesa during which etching said refractory metal layer is the etch mask for said gold layer.

10. The invention according to claim 9 wherein said schottky metal layer has an undercut below said gold layer to reduce the lateral horizontal width of said schottky metal layer and provide a smaller area schottky junction.

11. A schottky junction diode comprising:
a substrate having a mesa stacked thin horizontal semiconductor layer with exposed right and left edges at generally vertical right and left sides of the mesa;
right and left schottky metal layers each having a generally vertical portion over respective said right and left semiconductor layer edges and forming respective right and left generally vertical schottky junctions therewith,
wherein said substrate has an insulating portion extending between right and left sections of said semiconductor layer to divide and isolate same into said right and left sections, and comprising right and left cathode contacts on respective upper planar horizontal surfaces of said right and left semiconductor layer sections and horizontally spaced from respective said right and left schottky junctions and providing separate isolated cathode current collectors for respective right and left diodes.

12. A schottky junction diode array comprising:
a substrate having a mesa stacked horizontal semiconductor layer with exposed right and left edges at generally vertical right and left sides of the mesa;
second right and left semiconductor layers having different carrier concentration than said first semiconductor layer and formed at said right and left exposed edges, respectively;
a schottky metal layer having a generally vertical portion over at least one of said second semiconductor layers and forming a generally vertical schottky junction therewith, said schottky metal layer providing an anode current emitter for the diode; and
a second metal layer providing an ohmic contact to said first mentioned semiconductor layer and a cathode current collector for the diode,
wherein said second metal layer has an upper generally horizontal section extending along a portion of the upper surface of said first semiconductor layer, said second metal layer having a generally vertical portion over the other of said second semiconductor layers and extending downwardly to a lower generally horizontal portion on said substrate, which lower portion extends to and becomes the schottky metal layer of the next diode, said second metal layer being the cathode for the first mentioned diode and being the anode for said second mentioned diode.

* * * * *